US008283680B2

(12) United States Patent
Repetto et al.

(10) Patent No.: US 8,283,680 B2
(45) Date of Patent: *Oct. 9, 2012

(54) METHOD FOR MANUFACTURE OF TRANSPARENT DEVICES HAVING LIGHT EMITTING DIODES (LED)

(75) Inventors: Piermario Repetto, Turin (IT); Sabino Sinesi, Turin (IT); Sara Padovani, Turin (IT); Stefano Bernard, Turin (IT); Denis Bollea, Turin (IT); Davide Capello, Turin (IT); Alberto Pairetti, Udine (IT); Michele Antonipieri, Udine (IT)

(73) Assignee: Societa Consortile per Azioni, Turin (IT)

( * ) Notice: Subject to any disclaimer, the term of this patent is extended or adjusted under 35 U.S.C. 154(b) by 1088 days.

This patent is subject to a terminal disclaimer.

(21) Appl. No.: 11/398,358

(22) Filed: Apr. 5, 2006

(65) Prior Publication Data
US 2006/0239037 A1    Oct. 26, 2006

(30) Foreign Application Priority Data

Apr. 21, 2005  (EP) .................................. 05425254

(51) Int. Cl.
*H01L 29/18* (2006.01)
(52) U.S. Cl. ..................... 257/88; 257/99; 257/E33.062
(58) Field of Classification Search .................... 257/88, 257/99, E33.062
See application file for complete search history.

(56) References Cited

U.S. PATENT DOCUMENTS

| 4,274,217 | A | 6/1981 | Ohshima | 40/451 |
|---|---|---|---|---|
| 5,436,535 | A | 7/1995 | Yang | 315/313 |
| 6,448,900 | B1 | 9/2002 | Chen | 340/815.45 |
| 7,884,784 | B2 * | 2/2011 | Repetto et al. | 345/82 |
| 7,932,524 | B2 * | 4/2011 | Repetto et al. | 257/88 |
| 2003/0071270 | A1 | 4/2003 | Fuwausa et al. | 257/98 |
| 2003/0072153 | A1 | 4/2003 | Matsui et al. | 362/231 |
| 2003/0112418 | A1 | 6/2003 | Leleve et al. | 353/97 |
| 2003/0209714 | A1 | 11/2003 | Taskar et al. | 257/79 |

FOREIGN PATENT DOCUMENTS

| EP | 0681325 | A2 | 11/1995 |
| EP | 0684648 | A2 | 11/1995 |
| EP | 1148540 | A2 | 10/2001 |
| EP | 1420462 | A1 | 5/2004 |
| EP | 1450416 | A1 | 8/2004 |

OTHER PUBLICATIONS

U.S. Appl. No. 11/397,225, filed Apr. 4, 2006, Repetto et al.
U.S. Appl. No. 11/399,208, filed Apr. 6, 2006, Repetto et al.
European Patent Office Search Report, Application No. 05425254.9-2203, Dec. 2, 2005, 4 pages.

* cited by examiner

*Primary Examiner* — Jack Chen
(74) *Attorney, Agent, or Firm* — Heslin Rothenberg Farley & Mesiti P.C.; Victor A. Cardona, Esq.

(57) ABSTRACT

A method of fabrication of transparent LED devices, of the type comprising the operations of: i) providing a series of conductive paths on a transparent underlayer; ii) connecting said conductive paths to electronic control means; iii) associating to said underlayer an array of LED sources addressable individually or in groups through said conductive paths, in which i) said LED sources are integrated in the form of chips, i.e., of elements obtained by dividing up a semiconductor wafer and without package, via technologies of the chip-on-board type; ii) said method envisages the use of the flip-chip technique for die bonding, i.e., the electrical connection of the chip to the underlayer.

12 Claims, 9 Drawing Sheets a)

b)

c)

METHOD FOR MANUFACTURE OF TRANSPARENT DEVICES HAVING LIGHT EMITTING DIODES (LED)

CROSS-REFERENCE TO RELATED APPLICATION

This application claims priority from European Patent Application No. 05425254.9, filed on Apr. 21, 2006, the entire disclosure of which is incorporated herein by reference.

BACKGROUND OF THE INVENTION

The present invention relates to a method for the fabrication of transparent displays using light-emitting diodes (LEDs), in which the following operations are envisaged:
  providing a completely transparent underlayer with conductive paths;
  associating to said underlayer an array of LEDs in the form of chips by means of an operation of die bonding, in particular using the flip-chip technique;
  using an anisotropic conductive paste for connection of the LED chips to the underlayer; and
  protecting the light-emitting devices from mechanical and external environmental stresses via the deposition on the chip of a packaging material.

As is known, LED sources can be integrated directly in the form of chips or dice (multilayer semiconductor elements that emit light radiation if electrically supplied on a printed circuit. Some possible applications are light-signalling devices, headlights or other lights for motor vehicles, devices for providing information to the public, etc.

The technique for the fabrication of said devices goes under the name of chip-on-board (COB) technology and consists in mounting an array of LED chips directly on an appropriate underlayer. Said technology comprises first the process known by the term "die bonding" (thermal connection or electro-thermal connection of the die to the underlayer), associated to which are possible operations of wire bonding (electrical connection of the chip to the circuit). Amongst die-bonding techniques, the flip-chip methodology envisages turning-over of the chip and electro-thermal connection to the circuit of its pads without using wires for the electrical connection, thus excluding an additional wire-bonding process. In the flip-chip process, the connections of the pads are typically obtained by means of metal bumps (balls). As final step, the COB process envisages the packaging or protection of the source from the external stresses by means of appropriate resins.

Represented in FIG. 1 is a LED in the form of chip 10 with both of the metal connections (pads) 11 on the top surface of the die connected to a generic printed circuit 12, which carries conductive paths 13, by means of the wire-bonding technique (a) and flip-chip technique (b). In the first case (a), the electrical connections between the die and the circuit are made via metal wires 14; in the second case (b), the die 10 is turned upside down, and the metal pads 11 are directly connected to the paths 13 of the circuit.

There is known the technique of fabrication of devices using LED chips by means of the consolidated technology of wire bonding for the electrical connection of the chip to the transparent underlayer. In the case where the aim is to provide a transparent device, it is necessary to use a transparent underlayer (for example, plastic or glass) and conductive paths that are also transparent (made, for example, of transparent conductive oxide or TCO). In this case, however, in addition to the transparent conductive paths made of TCO, it is necessary to provide isles made of metal (usually gold, Au), to enable bonding of the wire to the underlayer, with the consequent following disadvantages:
  lower transparency of the device on account of the presence of the metal isles;
  longer time and higher costs of fabrication in so far as it is necessary to introduce a step of selective deposition of the metal pads and a wire-bonding step;
  need for protecting also the metal wires used for wire bonding with the packaging resin to prevent breaking thereof; and
  light emission of the LED chip in part masked by the wires.

The wire-bonding step can moreover lead to a reduction of the production yields, following upon detachment or breaking of the wire during the process of packaging.

SUMMARY OF THE INVENTION

The purpose of the present invention is to overcome the aforesaid problems using the flip-chip technique for connection of the LED chips to the underlayer.

The realization of said invention envisages the use of LED chips with both of the metal pads on the same face (usually the bottom face, if mounted in a flip-chip configuration) and with transparent underlayer (usually SiC or $Al_2O_3$). These types of chips are designed in such a way that light emission is favoured in the flip-chip configuration, see FIG. 1, detail (b).

According to a preferred embodiment, described in claim 2, the present invention envisages the use of anisotropic electrically conductive paste for the electrical connection of the chip directly to the paths. The anisotropy of the paste means that electrical conduction will occur only in a direction substantially perpendicular to the underlayer 15, thus preventing the two electrodes of the LED chip, albeit both physically in contact with the same drop of paste, from being mutually short-circuited.

Unlike the known art of die bonding, which uses metal bumps, the technique of bonding using anisotropic conductive resin does not require the use of metal pads.

BRIEF DESCRIPTION OF THE DRAWINGS

The invention will now be described with reference to the annexed plate of drawings, in which.

DETAILED DESCRIPTION OF THE INVENTION

Figure 1:
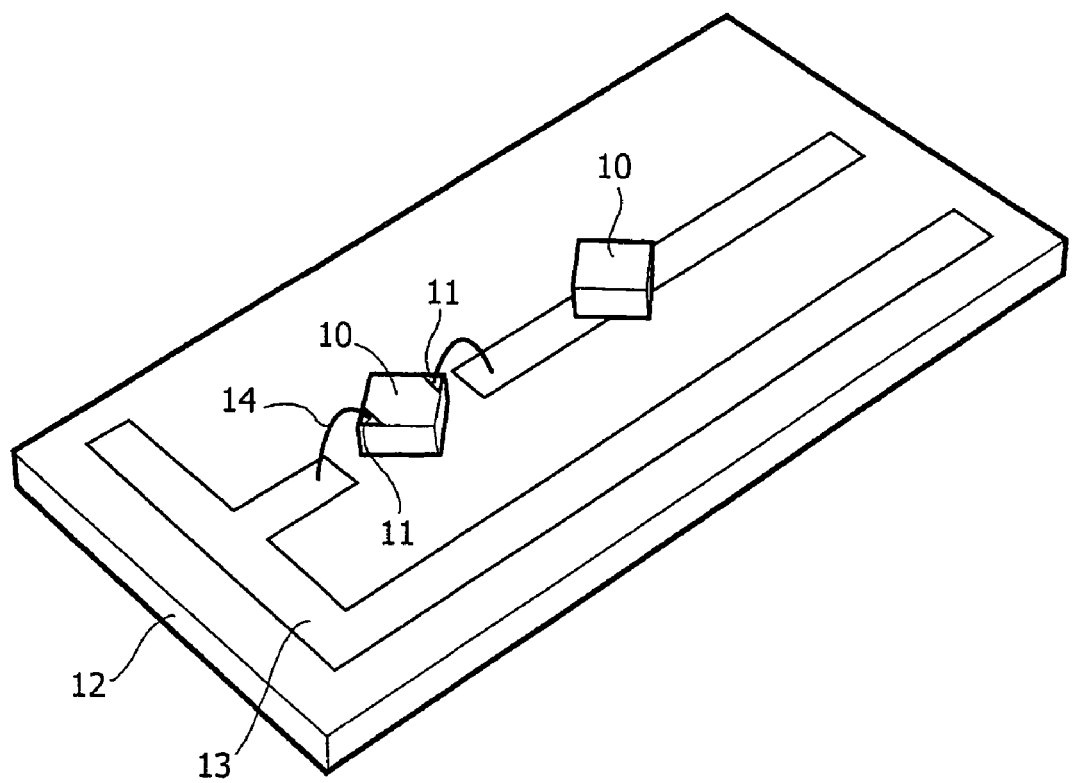
FIG. 1 illustrates the known solution described above.
Figure 2A:
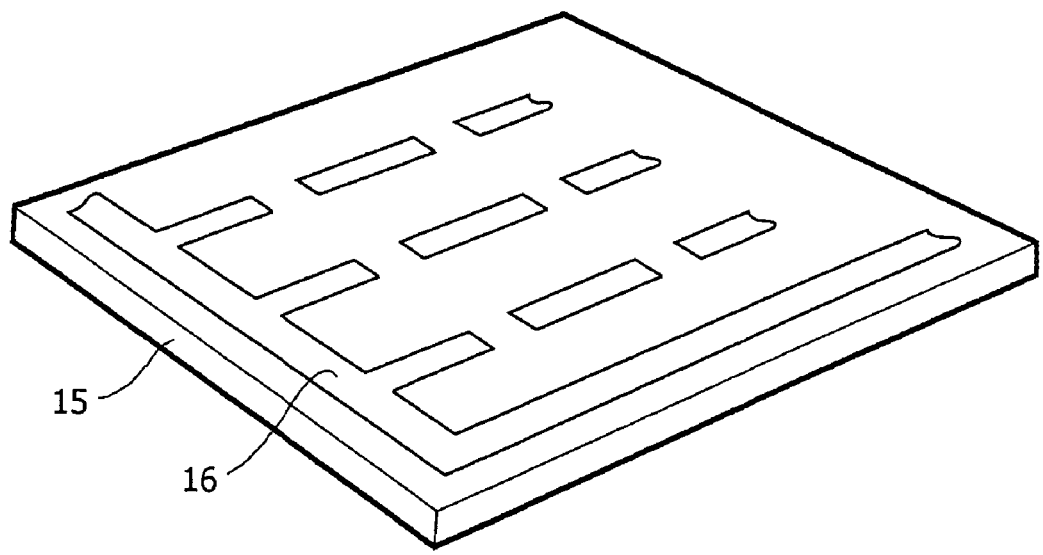
FIGS. 2-10 illustrate different variants of the invention.
Figure 2B:
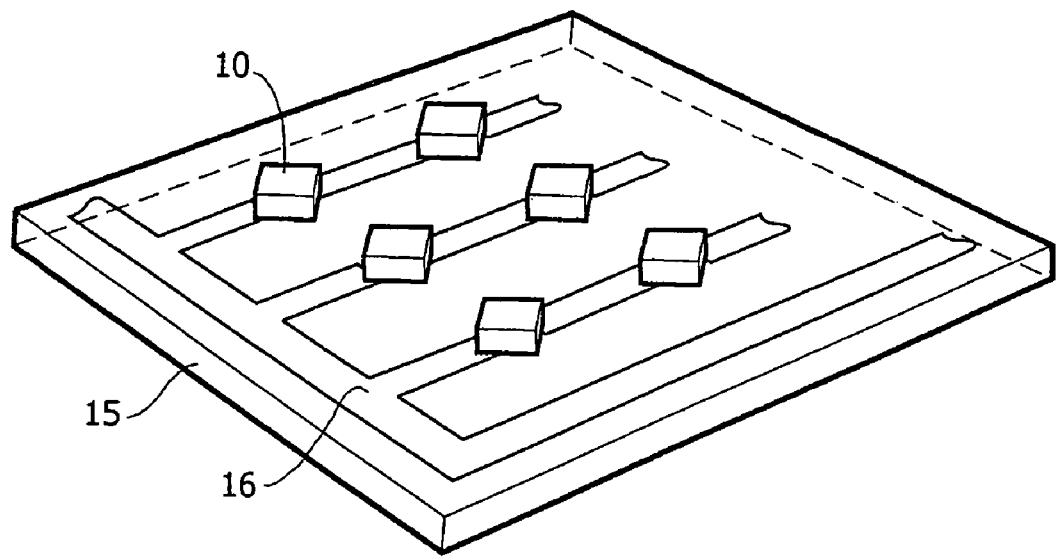
Figure 2C:
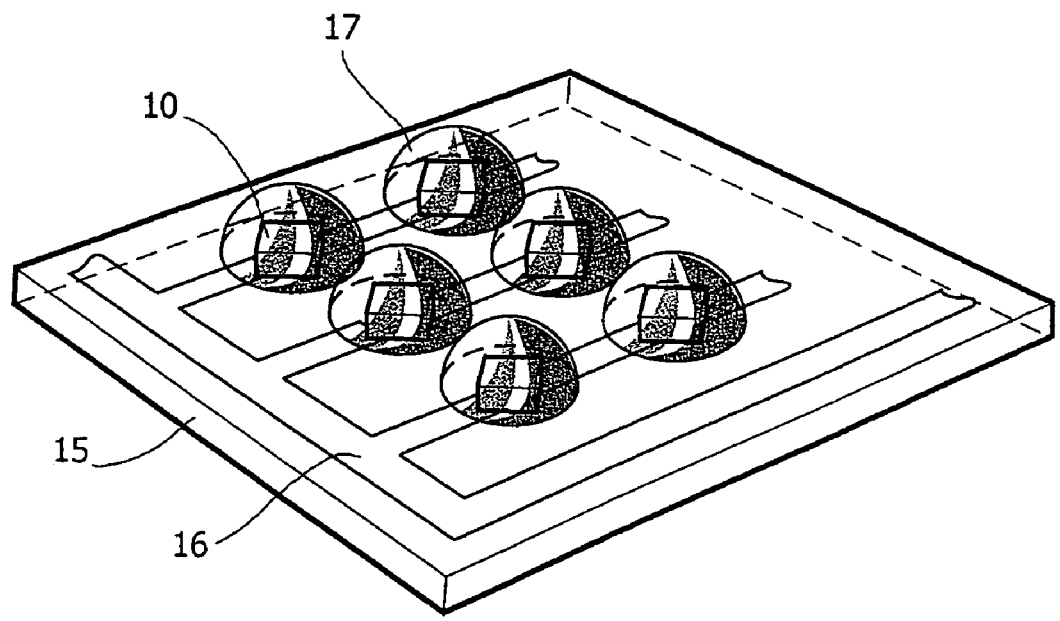

FIGS. 2a, 2b, 2c are schematic illustrations of the process of fabrication of the device according to a preferred embodiment. The process involves the following steps:
  1. fabrication of a transparent underlayer 15 with conductive paths 16 made of TCO (FIG. 2a);
  2. dispensing of the anisotropic paste in areas corresponding to the positions envisaged for the LED chips 10;
  3. positioning of the LED chips 10 with metal pads facing the underlayer 15 (flip-chip) in areas corresponding to the path of TCO 16 (FIG. 2b);
  4. thermal curing of the anisotropic paste; and
  5. packaging of the individual chip (or set of chips) with appropriate resin for increasing the light emission thereof and for protecting it from external stresses; as may be seen from FIG. 2c, each of the chips is coated with a so-called glob-top 17, i.e., a resinous package, substantially in the form of a dome.

According to a variant of the present invention, the use of a (glass or plastic) overlayer 15' is envisaged. Said overlayer 15' has the function of guaranteeing the planarity of the protective layer of transparent resin, not only in order to ensure transparency of the device but also to ensure that the panel will not distort the vision of the background and/or will not introduce optical power.

Figure 9:
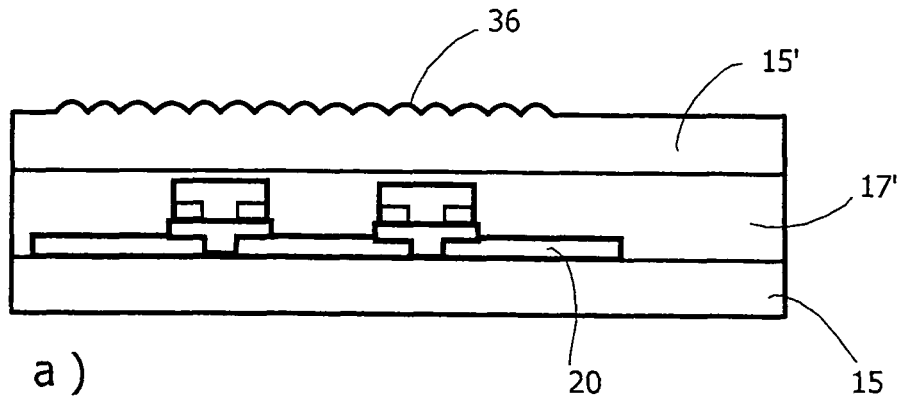
Figure 9:
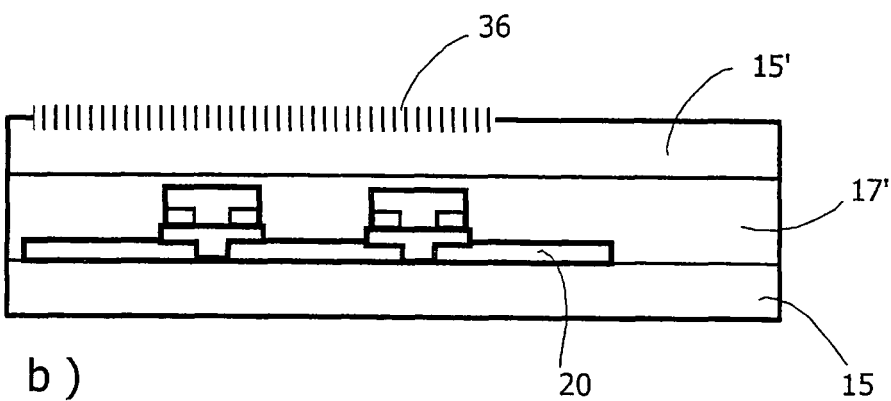
Figure 9:
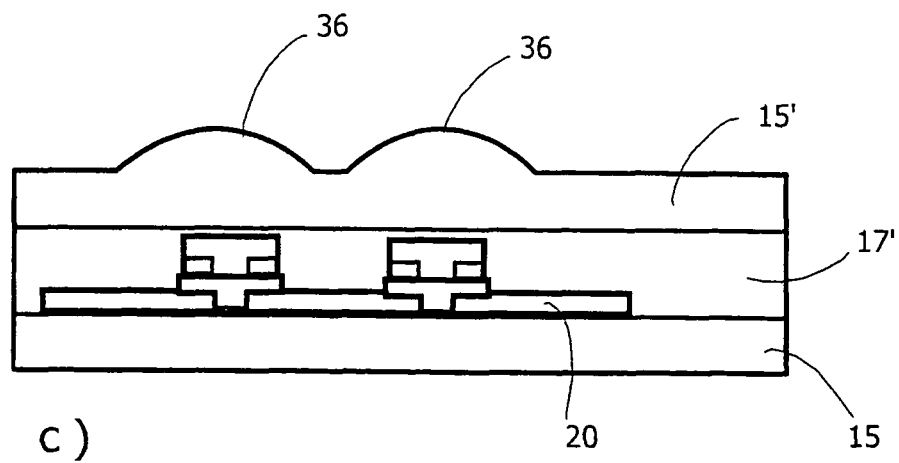

In this case, the glob-top 17 is replaced by a continuous layer 17' of resin that remains encapsulated between the underlayer 15 and the overlayer 15' (FIG. 9).

From the foregoing description, the advantages of the method proposed emerge clearly. The biggest advantage lies in the excellent transparency of the device: only in areas corresponding to the LED chips (typically having a surface area of 0.1 mm$^2$) will dark areas be formed. Furthermore, with this method it is possible to obtain displays with higher densities of points of light, eliminating the space necessary for the electrical connections via wires.

The conductive paths made of TCO can be replaced by metal paths. This enables reduction of the costs of the device, even though the transparency of the device proves evidently lower. The lower resistivity of metal as compared to TCO enables, given the same thickness and width of the paths, reduction of the supply voltages, or else, given the same supply voltage, reduction of the dimensions of the paths.

Figure 3A:
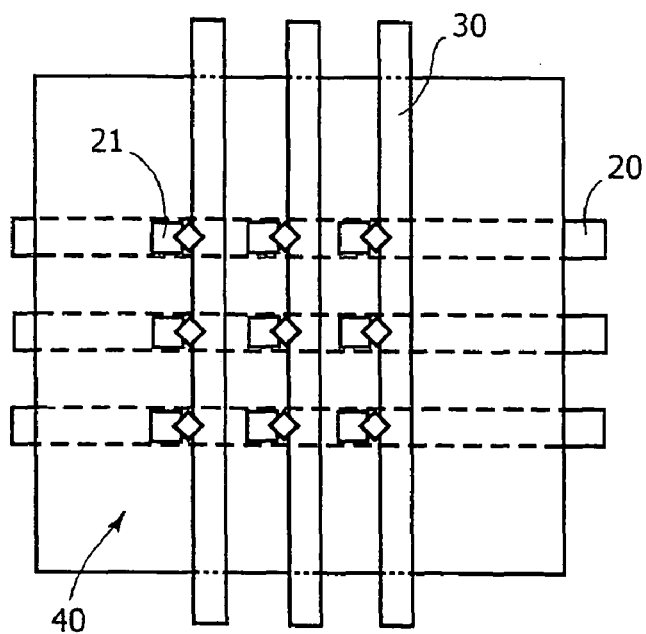

In a further preferred embodiment, represented in FIG. 3, the LED chips are arranged in a matrix configuration, in which each LED is positioned at the point of crossing-over between a row 20 and a column 30, said row 20 and column 30 being constituted by paths of conductive material, in such a way that each single LED chip is addressable individually through the application of an appropriate potential difference between said row and said column.

The rows are electrically insulated from the columns through a layer 40 of electrically insulating material, for example, silicon oxide, deposited on said rows 20 (for example, through an operation of thermal evaporation, e-beam evaporation, sputtering, CVD, spinning, dipping, etc.).

Subsequently deposited on said layer 40 are the columns 30, constituted by electrically conductive material, for example, a metal or a transparent conductive oxide TCO.

Figure 3B:
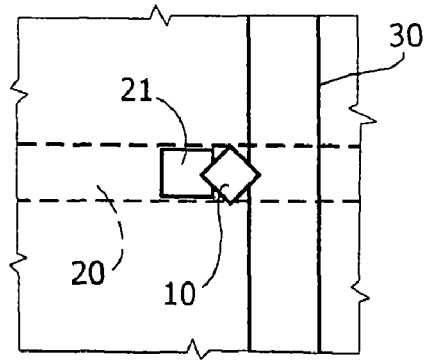
Figure 3C:
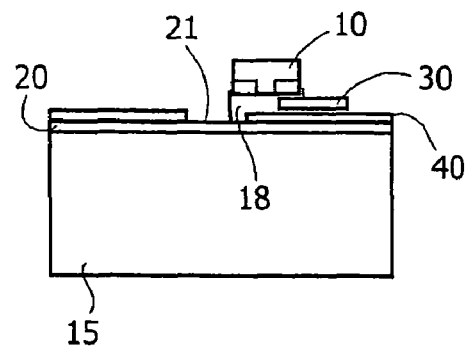

In a preferred embodiment represented in FIGS. 3*b* and 3*c*, the layer 40 of electrically insulating material is removed only in areas corresponding to purposely provided pads 21, one for each LED, so as to enable access to the underlying row 20 of conductive material. Finally, according to the present invention, the LED chips are positioned on the underlayer by means of the flip-chip technique, in such a way that one of the two electrodes is in an area corresponding to a pad 21 and the other electrode in an area corresponding to a column 30 of conductive material. The electrical contact between the electrodes and the respective conductive paths is obtained with the anisotropic conductive resin 18.

Figure 4A:
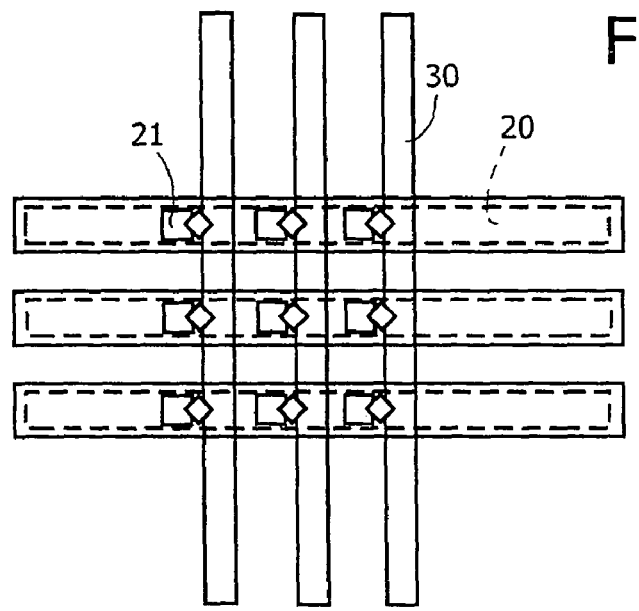
Figure 4B:
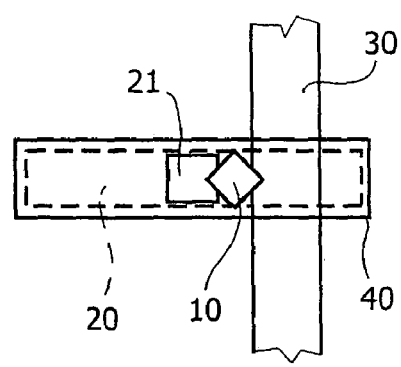
Figure 4C:
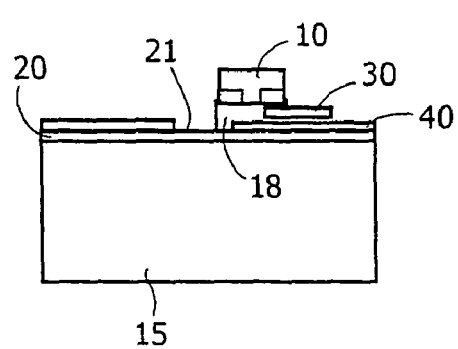

In a variant of this embodiment, represented in FIGS. 4*a*, 4*b* and 4*c*, the layer 40, as well as in the areas corresponding to said pads 21, is also removed in areas corresponding to the spaces located between adjacent rows 20.

Figure 5A:
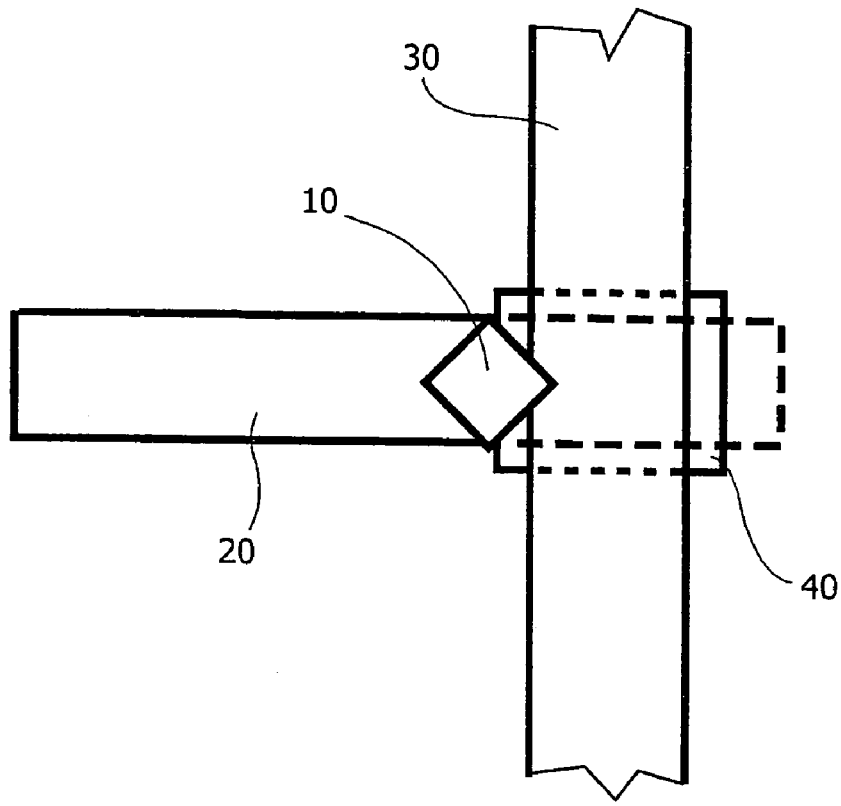
Figure 5B:
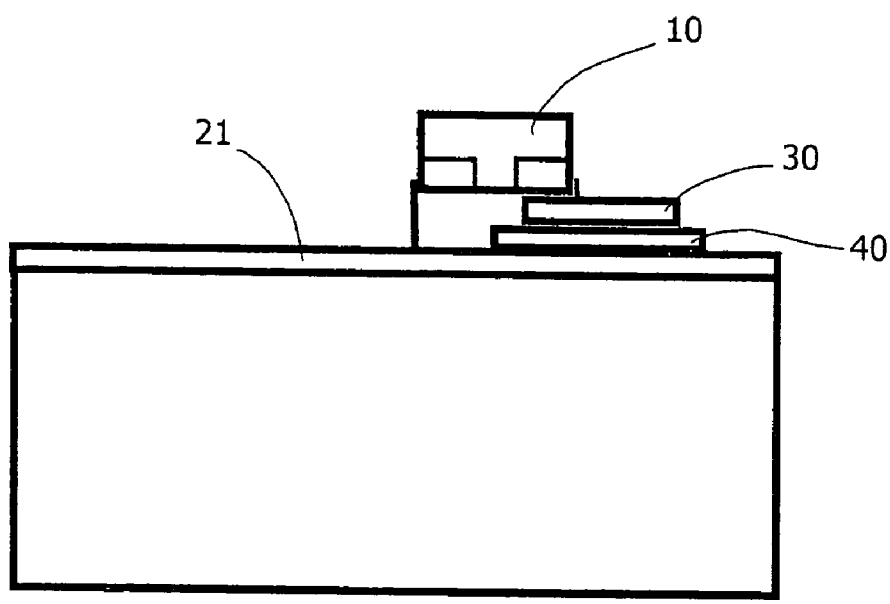

In a further embodiment, represented in FIGS. 5*a* and 5*b*, the layer 40 is removed from the entire underlayer except for purposely provided pads positioned at the point of crossing-over between said rows 20 and said columns 30.

Figure 6:
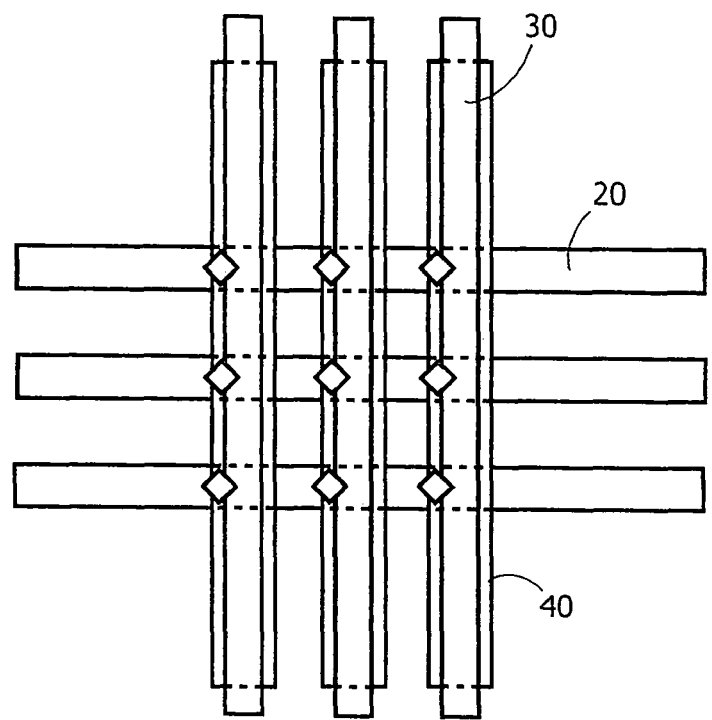

In another embodiment, represented in FIG. 6, the layer 40 is removed in areas corresponding to the spaces set between adjacent columns 30.

Figure 7:
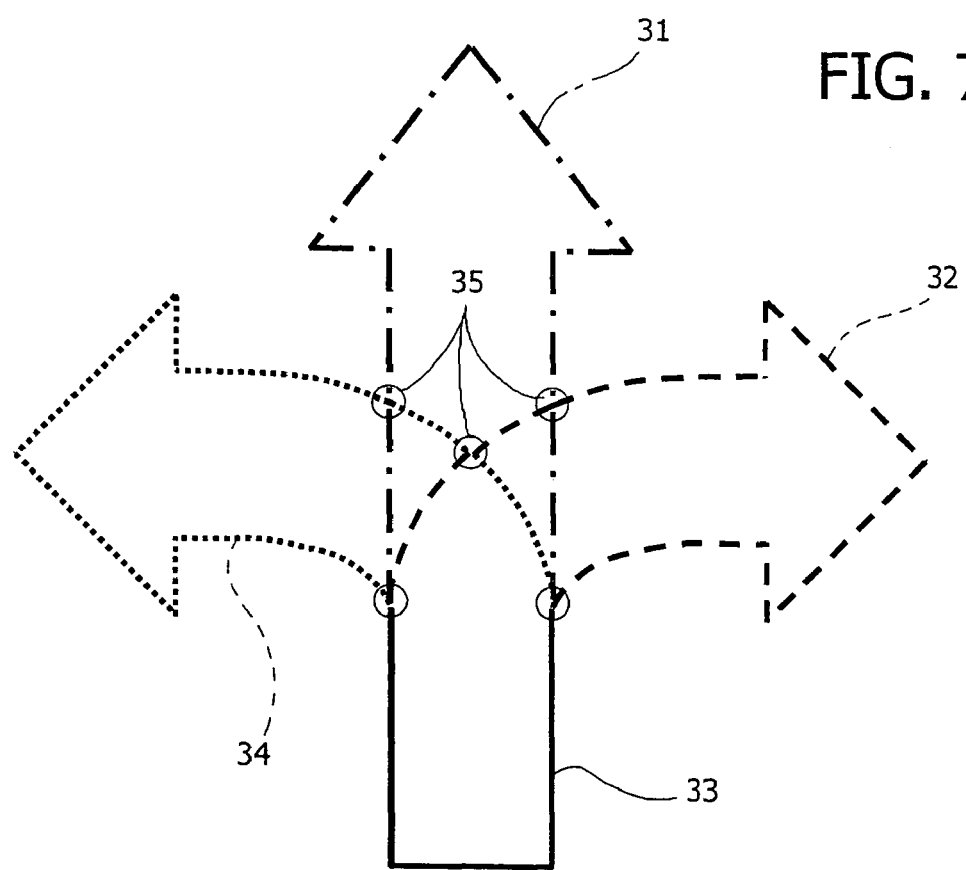
Figure 8A:
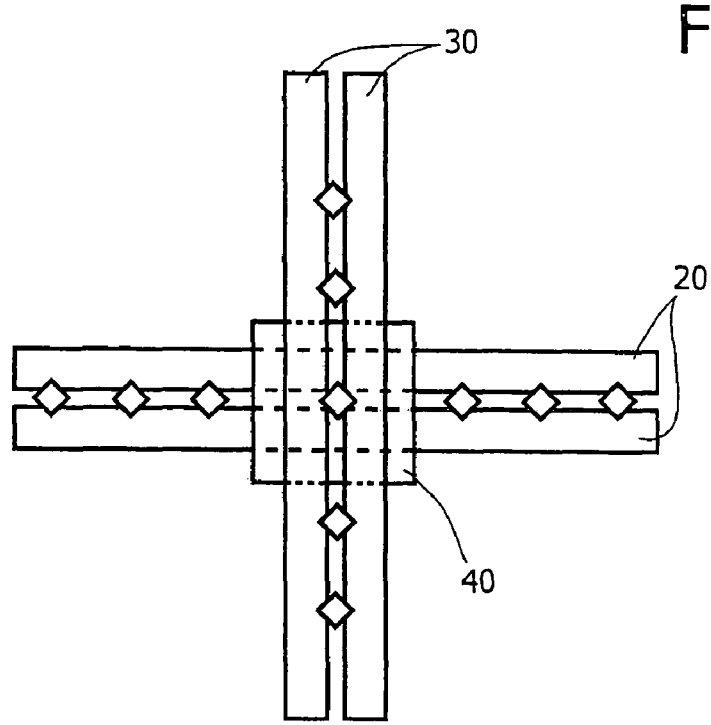
Figure 8B:
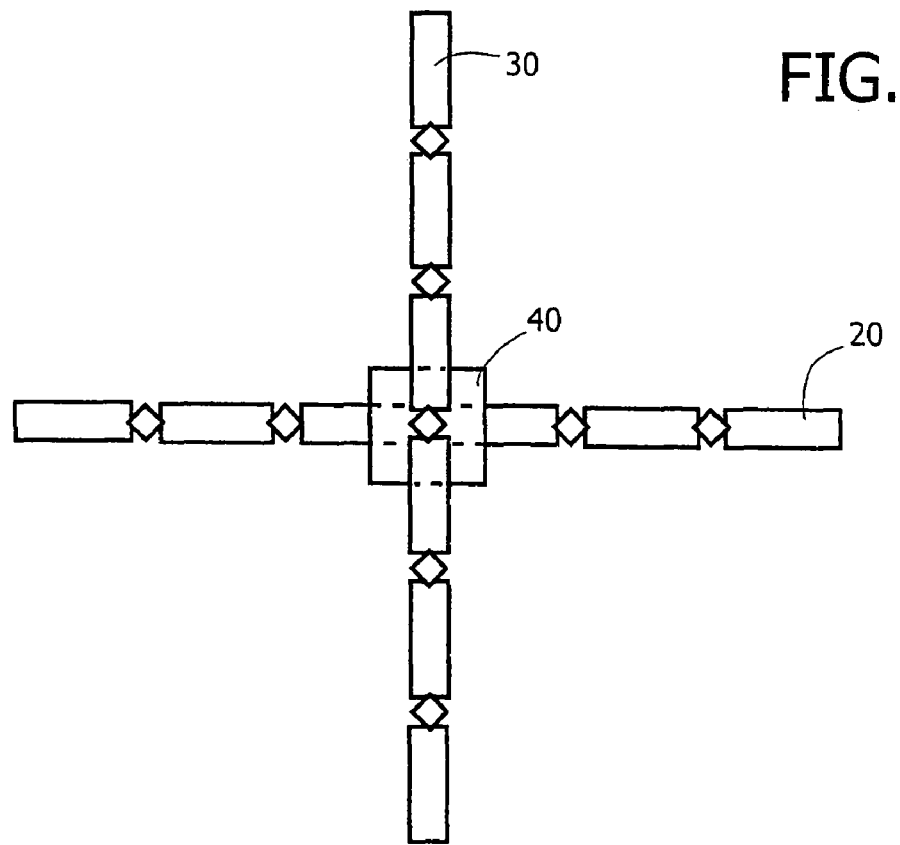

In yet a further embodiment, represented in FIGS. 7 and 8, the LEDs are not arranged in a matrix configuration (i.e., individually addressable), but rather are addressable in groups, with the LEDs of each group electrically connected together in parallel (FIG. 8*a*) or in series (FIG. 8*b*).

FIG. 7 illustrates an example of an image that can be presented on a display according to the present invention. Each segment (31, 32, 33 and 34) represents a set of LEDs electrically connected in parallel (FIG. 8*a*) or in series (FIG. 8*b*).

In the embodiment represented in FIG. 8*a*, each segment (20 and 30), which is addressable in an independent way, is constituted by a pair of parallel paths, one of which is electrically connected to the electrodes of the same type (for example, the cathodes) of a parallel of LEDs, whilst the other is electrically connected to the electrodes of the other type (for example, the anodes). In the points of intersection 35 between two or more segments it is necessary to insulate electrically the paths belonging to different segments. This is obtained, according to the present invention, by depositing on the paths 20 of one of said segments, in areas corresponding to the point of intersection 35, a pad 40 of electrically insulating material, on which the paths 30 of the second of said segments are subsequently deposited.

Presented in FIG. 8*b* is a variant in which both of the segments are constituted by a set of LEDs connected together in series. In the point of intersection 35 between the two segments, the electrical insulation between the path 20 of the first segment and the path 30 of the second segment is obtained in a way similar to what has been described with reference to FIG. 8*a*.

Figure 10:
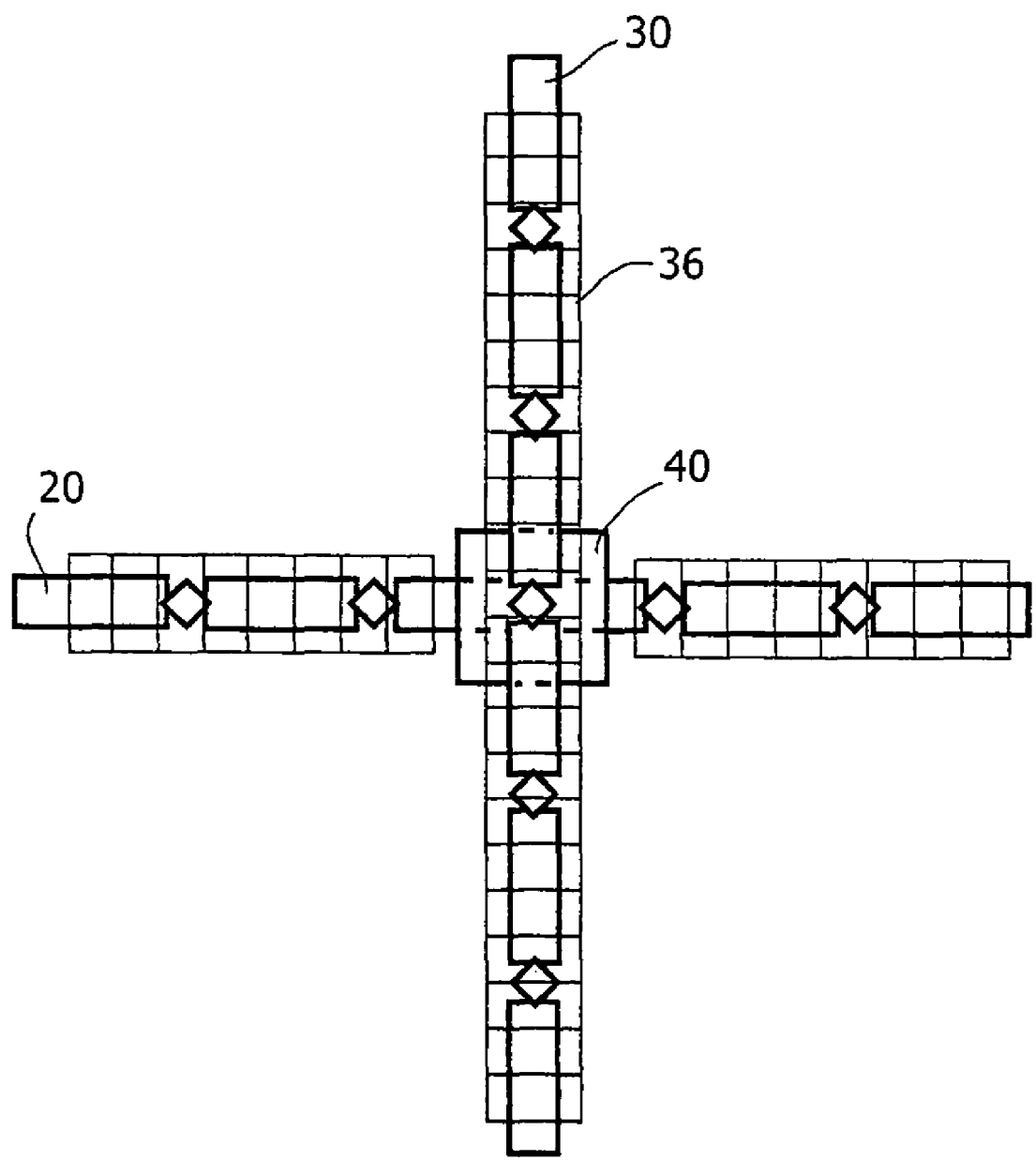

Once again with reference to FIGS. 7 and 8, it is evident that the smaller the number of LEDs used to obtain the segments 31, 32, 33 and 34, the more the appearance of said segments of the image will be dashed.ccc In order to limit the number of LED sources, at the same time reducing this effect of dashed appearance of the image, according to a variant of said invention (FIGS. 9 and 10) the aim is to provide on the outer surface of the underlayer 15 and/or of the overlayer 15', in areas corresponding to the LED chip, appropriate micro-indentations 36 along the connection line of the LED chip, said micro-indentations 36 having the function of extracting light from the underlayer 15 and/or from the overlayer 15', so as to connect the points of light and generate light images in the form of continuous lines.

The above effect can be further reinforced by the metal pads that are deposited on the paths made of TCO for the purpose of improving adhesion of the bonding operations (or else directly by the conductive paths 20, 30 that connect the sources, in the case where said paths are made of metal instead made of TCO). In fact, said pads tend to reflect part of the light emitted by the lateral surfaces of the LED chip; the light reflected impinges upon the micro-indentations 36, which produce an increase in the effective dimensions of the source.

A further solution that can be adopted is to deposit the protective resin 17' in the form of paths that connect the different LED chips. The light emitted by the LED chips is thus in part entrapped by said paths of resin (light-guide effect) and subsequently extracted by purposely provided micro-indentations 36 made on the surface of said path of resin, or else, in the case where an overlayer 15' is used, on the surface of said overlayer.

Said micro-indentations 36 can be in the form of cylindrical microlenses with axis perpendicular to the connection line of the LED chip (FIG. 9*a*), generic grooves made along an axis perpendicular to the connection line of the LED chip (FIG. 9*b*), cylindrical lenses (one for each chip) with axis perpendicular to the line of connection of the chips (FIG. 9*c*).

Alternatively, said micro-indentations can be in the form of microlenses with rotational symmetry, each microlens having its axis of symmetry perpendicular to said underlayer 15 and passing through the centre of one of said LED chips.

The micro-indentations 36 may also be simply areas with high roughness, such as to diffuse the light emitted by the LEDs.

According to a further variant of the present invention, the aforesaid effect of dashed appearance of the image can be reduced or eliminated using a density of LED sources, i.e., a number of LED chips per unit length, such that the angular separation between two sources with respect to the eye of the user is comparable with the angular resolution of the eye.

By way of example, if the display is installed at a distance of 1 m from the driver and the distance between two adjacent dice is 0.3 mm, i.e., comparable with the dimensions of the die, the angular separation between the LED appears as approximately 1 minute of arc, equal to the resolution of the eye in the fovea.

It is known, however, how the eye tends to merge points that are angularly separated by up to 3 minutes of arc, which would enable the spacing between the pixel up to 1 mm to be increased, thus reducing the number of sources necessary by a factor of 3.

What is claimed is:

1. A transparent LED display, comprising:
   a series of conductive paths on a transparent underlayer;
   said conductive paths connected to electronic control means;
   said transparent underlayer associated to an array of LED sources addressable individually or in groups through said conductive paths;
   said LED sources integrated in the form of chips, said chips comprising elements obtained by dividing up a semiconductor wafer and without package, on said transparent underlayer of a chip-on-board type; and
   said chip electrically connected to said underlayer using a flip-chip technique for die bonding.

2. The device according to claim 1, wherein said LED sources are arranged in a group configuration, in which the LED sources belonging to one and the same group are electrically connected in series so as to form a segment of curve, or of straight line, or of broken line.

3. The device according to claim 2, wherein paths of said series of conductive paths belonging to two different segments are electrically insulated from one another in areas corresponding to the points of intersection between said segments, depositing on the paths of one of said segments, in areas corresponding to the point of intersection, a pad of electrically insulating material, on which the paths of the second of said segments are subsequently deposited.

4. The device according to claim 1, wherein micro-indentations are made on the surface of at least one of said transparent underlayer and an overlayer in areas corresponding to connection lines between adjacent LED chips, in such a way that the points of light visible to the user when said LED chips are turned on are connected by segments of light which are also visible to the user.

5. The device according to claim 4, wherein the light image perceived by the user appears as a distribution of segments of curve, or of straight line, or of broken line.

6. The device according to claim 4, wherein said micro-indentations are in the form of cylindrical lenses having axes perpendicular to said connection lines.

7. The device according to claim 4, wherein said micro-indentations are in the form of microlenses with rotational symmetry, each microlens having an axis of symmetry perpendicular to said underlayer and passing through the centre of one of said LED chips.

8. The device according to claim 4, wherein said micro-indentations are in the form of grooves made along an axis perpendicular to said connection lines.

9. The device according to claim 1, wherein it uses LED chips of different colours.

10. The display according to claim 1, wherein said LED sources in the form of chips 10 are angularly separated, with respect to the eyes of the user, by an angle of less than three minutes of arc.

11. The display according to claim 1, wherein the luminance of said LED sources is higher than 3000 cd/m$^2$.

12. The display according claim 1, wherein the transmittance of the display is higher than 60%.

* * * * *